(12) United States Patent
Chen et al.

(10) Patent No.: US 10,553,687 B2
(45) Date of Patent: Feb. 4, 2020

(54) SEMICONDUCTOR DEVICE HAVING CONDUCTIVE FEATURE OVERLAPPING AN EDGE OF AN ACTIVE REGION

(71) Applicant: TAIWAN SEMICONDUCTOR MANUFACTURING COMPANY, LTD., Hsinchu (TW)

(72) Inventors: Po-Yu Chen, Baoshan Township (TW); Wan-Hua Huang, Hsinchu (TW); Jing-Ying Chen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 264 days.

(21) Appl. No.: 14/051,724

(22) Filed: Oct. 11, 2013

(65) Prior Publication Data
US 2015/0102427 A1  Apr. 16, 2015

(51) Int. Cl.
| H01L 29/40 | (2006.01) |
| H01L 29/78 | (2006.01) |
| H01L 29/06 | (2006.01) |
| H01L 29/423 | (2006.01) |
| H01L 29/66 | (2006.01) |

(52) U.S. Cl.
CPC ........ *H01L 29/402* (2013.01); *H01L 29/0619* (2013.01); *H01L 29/0692* (2013.01); *H01L 29/42368* (2013.01); *H01L 29/66689* (2013.01); *H01L 29/7816* (2013.01)

(58) Field of Classification Search
CPC ......... H01L 29/402; H01L 2924/13055; H01L 21/8249; H01L 29/866; H01L 29/872; H01L 29/735; H01L 29/66143; H01L 29/0692; H01L 29/42368; H01L 29/0619; H01L 29/66681–66689; H01L 29/7816–7826
USPC .......................... 257/405–515, 330, 336, 343
See application file for complete search history.

(56) References Cited

U.S. PATENT DOCUMENTS

| 4,785,343 A | * | 11/1988 | Nezu ..................... H01L 29/402 257/394 |
| 5,811,850 A | * | 9/1998 | Smayling .............. H01L 27/088 257/335 |
| 2006/0071273 A1 | * | 4/2006 | Hiroki .......................... 257/343 |
| 2011/0079849 A1 | * | 4/2011 | Yan ..................... H01L 29/0696 257/343 |
| 2012/0187483 A1 | * | 7/2012 | Yang .................. H01L 29/0692 257/336 |

\* cited by examiner

*Primary Examiner* — Nelson Garces
(74) *Attorney, Agent, or Firm* — Hauptman Ham, LLP

(57) ABSTRACT

A semiconductor device includes a substrate having an active region, a drain region in the active region, a source region in the active region, a gate structure, and a conductive field plate. The gate structure extends in a first direction over the active region. The gate structure is arranged between the drain region and the source region in a second direction transverse to the first direction. The conductive field plate extends in the second direction over an edge of the active region.

20 Claims, 11 Drawing Sheets

SEMICONDUCTOR DEVICE HAVING CONDUCTIVE FEATURE OVERLAPPING AN EDGE OF AN ACTIVE REGION

BACKGROUND

As semiconductor devices are adapted for high voltage applications, a consideration in designing semiconductor devices involves breakdown voltage improvements. A breakdown voltage is a gate voltage at which the drain current sharply increases. A high breakdown voltage indicates the ability of the semiconductor device to withstand a high gate voltage without being damaged and/or exhibiting irregular current behaviors.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-6A are cross-sectional views similar to FIG. 1A, and showing the semiconductor device at the various stages in corresponding FIGS. 2-6.

FIGS. 2B-6B are cross-sectional views similar to FIG. 1B, and showing the semiconductor device at the various stages in corresponding FIGS. 2-6.

FIGS. 8A-9A are cross-sectional views similar to FIG. 1A, and showing the semiconductor device at the various stages in corresponding FIGS. 8-9.

FIGS. 8B-9B are cross-sectional views similar to FIG. 1B, and showing the semiconductor device at the various stages in corresponding FIGS. 8-9.

DETAILED DESCRIPTION

Figure 1A:
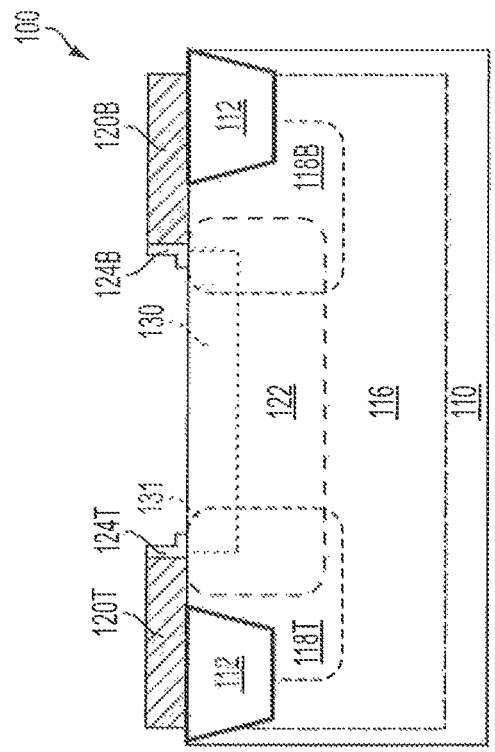
FIGS. 1A-1B are cross-sectional views taken along corresponding lines A-A' and B-B' in FIG. 1.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent, however, that one or more embodiments may be practiced without these specific details. Like reference numerals in the drawings denote like elements.

In some embodiments, a semiconductor device comprises an active region, a drain region and a source region in the active region, and a gate structure extending in a first direction over the active region. The gate structure is arranged between the drain region and the source region in a second direction transverse to the first direction. A conductive field plate extending in the second direction is formed over an edge of the active region. Alternatively or additionally, a lightly-doped well is formed in the substrate to overlap the edge of the active region. The presence of a field plate and/or a lightly doped well results in an approximately uniform electric field distribution along the edge of the active region which, in turn, improves the breakdown voltage characteristic of the semiconductor device.

Figure 1B:
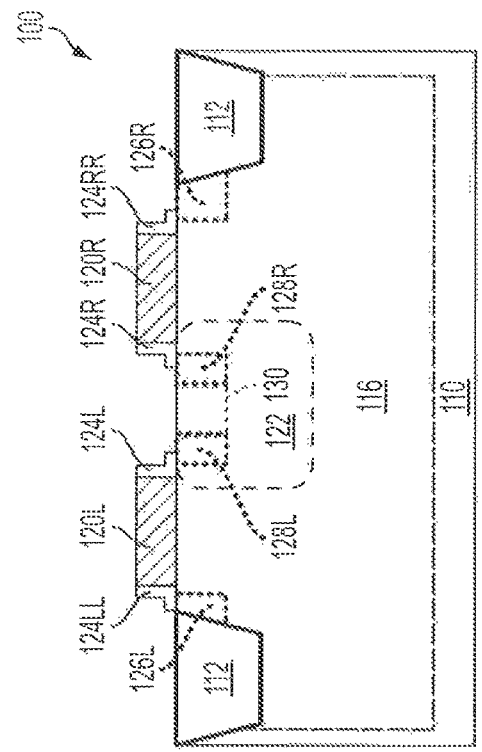
Figure 1:
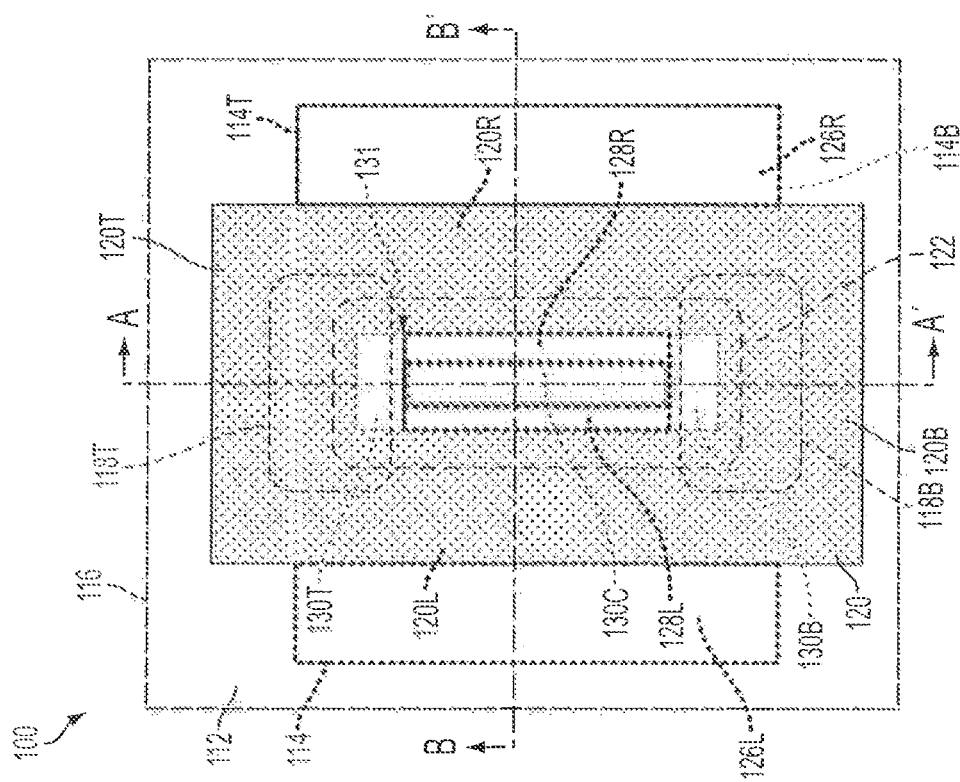
FIG. 1 is a top view of a semiconductor device in accordance with some embodiments.

FIG. 1 is a top view of a semiconductor device 100 in accordance with some embodiments. FIGS. 1A-1B are cross-sectional views taken along lines A-A' and B-B' in FIG. 1. The semiconductor device 100 comprises a substrate 110, an isolation structure 112, an active region 114 (best seen in FIG. 1), a high voltage (HV) well 116, at least one lightly doped well 118T, 118B, a gate structure 120 (best seen in FIG. 1), a standard well 122, one or more spacers 124T, 124B, 124L, 124R, 124LL, 124RR, at least one first drain/source region 126L, 126R, at least one second drain/source region 128L, 128R, and a heavily doped well 130.

The substrate 110 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 110 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, the substrate 110 comprises a p-type doped substrate. Examples of p-type dopants in the p-doped substrate 110 include, but are not limited to, boron, gallium, and indium. In at least one embodiment, the substrate 110 comprises a p-type doped silicon substrate.

The isolation feature 112 is formed in the substrate 110 to surround the active region 114, and to isolate the semiconductor device 100 from other devices on the same substrate 110. Examples of isolation features include, but are not limited to, field oxide (FOX) regions and shallow trench isolation (STI) structures. The active region 114 defines an active region of the semiconductor device 100 in which source and drain regions and a channel region are formed, as described herein.

The gate structure 120 is formed over the active region 114 of the substrate 110, and divides the active region 114 into at least one first drain/source region 126L, 126R, at least one second drain/source region 128L, 128R, and a channel region (not numbered). The channel region is arranged under the gate structure 120 and between the at least one first drain/source region 126L, 126R and the at least one second drain/source region 128L, 128R. As best seen in FIG. 1, the gate structure 120 includes a first section 120L, a second section 120R, a third section 120T and a fourth section 120B. The first section 120L and the second section 120R extend in a first direction along the cross-section line A-A' (referred to herein as the "first direction AA"), and are spaced from each other in a second direction along the cross-section line B-B' (referred to herein as the "second direction BB"). The third section 120T and the fourth section 120B extend in the second direction BB', and are spaced from each other in the first direction AA'. The third section 120T and the fourth section 120B connect the first section 120L and the second section 120R together into a ring-shaped gate structure. The described shape of a ring, or a closed loop, of the gate structure 120 is an example. Other shapes are within the scope of various embodiments.

The gate structure 120 overlaps at least one edge of the active region 114. For example, as best seen in FIG. 1, the third section 120T overlaps an edge 114T of the active region 114, and the fourth section 120B overlaps the opposite edge 114B of the active region 114. The gate structure 120 further overlaps the lightly doped wells 118T, 118B, at least partially. For example, as best seen in FIG. 1A, the third section 120T at least partially overlaps the lightly doped well 118T, and the fourth section 120B at least partially overlaps the lightly doped well 118B. The gate structure 120 includes a conductive material. Examples of conductive materials for the gate structure 120 include, but are not limited to, doped or non-doped polycrystalline silicon (also referred to herein as "polysilicon"), and metals, such as Al, Cu, W, Ti, Ta, and other suitable conductive materials, such as, TiN, TaN, NiSi, and CoSi.

In at least one embodiment, a gate dielectric layer (not shown) is arranged between the gate structure 120 and the channel region in the active region 114. In one or more embodiments, the gate dielectric layer comprises silicon oxide which is suitable for high voltage applications. Examples of other dielectric materials for the gate dielectric layer include, but are not limited to, a high-k dielectric material, silicon oxynitride, and other suitable dielectric materials. Examples of high-k materials include, but are not limited to, metal oxides, metal nitrides, metal silicates, transition metal-oxides, transition metal-nitrides, transition metal-silicates, oxynitrides of metals, metal aluminates, zirconium silicate, zirconium aluminate, hafnium oxide, and combinations thereof. In at least one embodiment, the gate dielectric layer includes a multilayer structure, e.g., a stack of a layer of silicon oxide and another layer of a high-k material. In some embodiments, the dielectric layer has a uniform thickness of 20-1200 Å.

The at least one first drain/source region 126L, 126R surrounding the gate structure 120. Specifically, the at least one first drain/source region 126L, 126R is arranged between the first section 120L and second section 120R in the first direction AA', and between the first section 120L and second section 120R in the second direction BB'. The at least one second drain/source region 128L, 128R is separated from the at least one first drain/source region 126L, 126R by the channel region under the gate structure 120. Specifically, the second drain/source region 128L and the second drain/source region 128R are arranged on opposite sides of the gate structure 120 in the second direction BB'. In at least one specific example described herein, the at least one first drain/source region 126L, 126R includes drain regions, and the at least one second drain/source region 128L, 128R includes source regions. However, in another example, the at least one first drain/source region 126L, 126R includes source regions, and the at least one second drain/source region 128L, 128R include drain regions. In at least one embodiment, the source regions 128L, 128R and the drain regions 126L, 126R include n-doped regions having at least one n-type dopant doped therein. Examples of n-type dopants include, but are not limited to, phosphorus, antimony and arsenic. In at least one embodiment, the n-doped regions of the source regions 128L, 128R and the drain regions 126L, 126R have a dopant concentration of 1E18~1e21 atoms/cm3, and a depth of 0.02~0.2 um (micron).

One or more spacers 124T, 124B, 124L, 124R, 124LL, 124RR, are formed over the sidewalls of the gate structure 120, as best seen in FIGS. 1A-1B. The spacers 124T, 124B, 124L, 124R, 124LL, 124RR are not illustrated in FIG. 1 for simplicity. The spacers 124L, 124R, 124T, and 124B are formed over and along the inner sidewalls of the corresponding first section 120L, second section 120R, third section 120T and fourth section 120B of the ring-shaped gate structure 120. The inner sidewalls are those facing the source regions 128L, 128R. The spacers 124LL and 124RR are formed over and along the outer sidewalls of the corresponding first section 120L and second section 120R of the ring-shaped gate structure 120. The outer sidewalls are those facing the drain regions 126L, 126R. In some embodiments, one or more of the spacers 124T, 124B, 124L, 124R, 124LL, 124RR, are omitted. Example materials for the spacers 124T, 124B, 124L, 124R, 124LL, 124RR include, but are not limited to, nitride, oxide, phosphors, oxynitrides, and TiN.

The HV well 116 is formed in the substrate 110. The HV well 116 is arranged under the isolation feature 112 and the active region 114. In at least one embodiment, the HV well 116 is an n-well doped with at least one n-type dopant. In at least one embodiment, the HV well 116 has a dopant concentration of 1E15~1E18 atoms/cm3, and a depth of 2~5 um. In at least one embodiment, the HV well 116 is omitted.

At least one lightly doped well 118T, 118B is formed in the HV well 116 to overlap at least one edge of the active region 114. For example, the lightly doped well 118T overlaps the edge 114T of the active region 114, and the lightly doped well 118B overlaps the opposite edge 114B of the active region 114. Each of the lightly doped wells 118T, 118B is arranged partially outside and partially inside the active region 114. The portions of the lightly doped wells 118T, 118B arranged outside the active region 114 are located under the isolation feature 112. The lightly doped wells 118T, 118B are spaced from each other in the first direction AA'. In one or more embodiments, the lightly doped wells 118T, 118B do not overlap the source regions 128L, 128R. The lightly doped wells 118T, 118B have a dopant conductivity opposite to that of the HV well 116. For example, when the HV well 116 includes an n-type dopant, the lightly doped wells 118T, 118B include p-wells doped with at least one p-type dopant. Examples of p-type dopants include, but are not limited to, boron, fluorine, and BF2. In at least one embodiment, the lightly doped wells 118T, 118B have a dopant concentration of 1E15~5e17 atoms/cm3, and a depth of 0.4~2 um. In at least one embodiment, one of the lightly doped wells 118T, 118B is omitted.

The standard well 122 is formed in the HV well 116. As best seen in FIG. 1, the standard well 122 extends around the source regions 128L, 128R. The standard well 122 further partially overlaps at least one lightly doped well 118T, 118B. The standard well 122 has a dopant conductivity same as the lightly doped wells 118T, 118B, and opposite to the HV well 116. For example, when the HV well 116 includes an n-type dopant, the standard well 122 includes a p-well doped with at least one p-type dopant. The dopant concentration of the p-type dopant of the lightly doped wells 118T, 118B is less than or equal to that of the standard well 122. In at least one embodiment, the standard well 122 has a dopant concentration of 1E15~1E18 atoms/cm3, and a depth of 0.2~4 um. In some embodiments, the lightly doped wells 118T, 118B have a greater depth than the standard well 122, as best seen in FIG. 1A. In at least one embodiment, the standard well 122 is omitted.

The heavily doped well 130 is formed within the standard well 122. As best seen in FIG. 1, the heavily doped well 130 includes a first section 130T, a second section 130B, and a third section 130C. The first section 130T and the second section 130B extend in the second direction BB' and are spaced from each other in the first direction AA'. The third section 130C extends in the first direction AA' and connects the first section 130T and second section 130B. A width of the third section 130C in the second direction BB' is smaller than those of the first section 130T and second section 130B. The source regions 128L, 128R are arranged between the first section 130T and second section 130B in the first direction AA', and are arranged on opposite sides of the third section 130C in the second direction BB'. Other configurations of the heavily doped well 130 and/or relative arrangements between the source regions 128L, 128R and the heavily doped well 130 are within the scope of various embodiments. In at least one embodiment, one or more of the first section 130T, second section 130B, and third section 130C are omitted. As best seen in FIGS. 1 and 1A, the heavily doped well 130 partially overlaps at least one lightly doped well 118T, 118B. For example, the first section 130T partially overlaps the lightly doped well 118T, and the second section 130B partially overlaps the lightly doped well 118B. The heavily doped well 130 has a dopant conductivity same as the lightly doped wells 118T, 118B, and opposite to the HV well 116. For example, when the HV well 116 includes an n-type dopant, the heavily doped well 130 includes a p-well doped with at least one p-type dopant. The dopant concentration of the p-type dopant of the standard well 122 is less than or equal to that of the heavily doped well 130. In at least one embodiment, the heavily doped well 130 has a dopant concentration of 1E18~1e21 atoms/cm3, and a depth of 0.02~0.2 um. In some embodiments, the standard well 122 has a greater depth than the heavily doped well 130, as best seen in FIGS. 1A-1B.

The conductivity types of various components of the semiconductor device 100 in the foregoing description are given for an n-type semiconductor device, such as an n-channel metal-oxide semiconductor (NMOS). In some embodiments, the semiconductor device 100 includes a p-type device, such as a p-channel metal-oxide semiconductor (PMOS). In such a p-type device, the conductivity types of various components of the semiconductor device 100 are opposite to those described in the foregoing description.

A factor that potentially imposes a limit on the breakdown voltage of a semiconductor device is the concentration of electric field at corners, tips or edges of the drain region and/or the source region. The higher the concentration of electric field, e.g., at a corner of the drain/source region, the higher the likelihood that a breakdown will occur at or in a vicinity of that corner.

In some embodiments, a conductive field plate is arranged over an edge of the active region of a semiconductor device. The field plate distributes the electric field along the edge of the active region and reduces the likelihood of an excessive electric field concentration at a point along the edge of the active region. As a result, there is a lower likelihood that the breakdown will occur in the OFF state of the semiconductor device when a high voltage is applied across the drain and source regions. The breakdown voltage of the semiconductor device is therefore improved.

In the semiconductor device 100 described herein, such a field plate is defined by the third section 120T and/or the fourth section 120B of the gate structure 120. The third section 120T and the fourth section 120B extend along and over the corresponding edges 114T, 114B of the active region 114. The third section 120T and the fourth section 120B comprise the conductive material of the gate structure 120 and are configured to distribute the electric field along the corresponding edges 114T, 114B of the active region 114, thereby increasing the breakdown voltage of the semiconductor device 100. The described field plate configuration in the form of the third section 120T and/or fourth section 120B of the gate structure 120 is an example. The field plate configuration in the form of a portion of the gate structure 120 in accordance with some embodiments is advantageous in that it is possible to form the field plate in the same process(es) using the same mask layer(s) for forming the gate structure 120, without significantly altering the manufacturing process. In some embodiments, it is possible to form the field plate as an electrode separate, physically and/or electrically, from the gate structure 120. Examples of conductive materials for the field plate include, but are not limited to, polysilicon, metals, and metal alloys.

In some embodiments, another approach for distributing the electric field over a larger area to avoid an excessive electric field concentration is to form at least one lightly doped well overlapping at least one edge of the active region of a semiconductor device. For example, in the semiconductor device 100 described herein, the lightly doped wells 118T, 118B are formed to overlap the corresponding edges 114T, 114B of the active region 114, thereby distributing the electric field over a larger area than when the lightly doped wells 118T, 118B are not provided. As a result, the breakdown voltage of the semiconductor device 100 is increased. In at least one embodiment, one of the described approaches for electric field distribution is used, i.e., either a field plate or a lightly doped well is formed to overlap an edge of the active region. In some embodiments, both of the described approaches are used, as described with respect to the semiconductor device 100.

In some embodiments, the first section 130T and/or the second section 130B of the heavily doped well 130 is/are configured to cutoff the channel region underlying the gate structure 120 at a corner of the source region 126R, as indicated at 131 in FIGS. 1 and 1A. As a result, there is a lower likelihood that the semiconductor device 100 will be turned ON in the OFF state due to a high voltage applied across the source and drain regions. In addition, the third section 130C of the heavily doped well 130 is configured as a pickup well region. As a result, the area of the semiconductor device 100 is reduced, compared to other approaches in which a pickup well region is provided as a separate region outside the active region 114.

The semiconductor device in accordance with some embodiments described herein is configured as a laterally diffused MOS (LDMOS) or extended drain MOS (EDMOS) with an increased breakdown voltage, without a significant increase of the ON resistance. Such a semiconductor device is suitable for high voltage applications, such as power management ICs (PMIC) for use in battery management, voltage regulation, charging functions, DC to DC converters, dynamic voltage scaling, pulse-frequency modulation (PFM), pulse-width modulation (PWM), switching amplifiers (such as Class-D electronic amplifiers). In at least one embodiment, a PMIC is manufactured using a BiCMOS process which combines the bipolar junction technology and the complementary metal-oxide-semiconductor (CMOS) technology.

A manufacturing process of the semiconductor device 100 in accordance with some embodiments will be now described with respect to FIGS. 2-6, 2A-6A and 2B-6B.

Figure 2A:
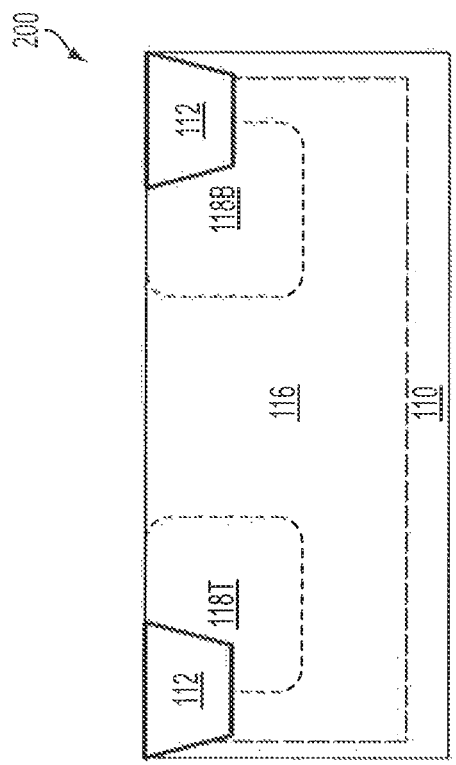
Figure 2B:
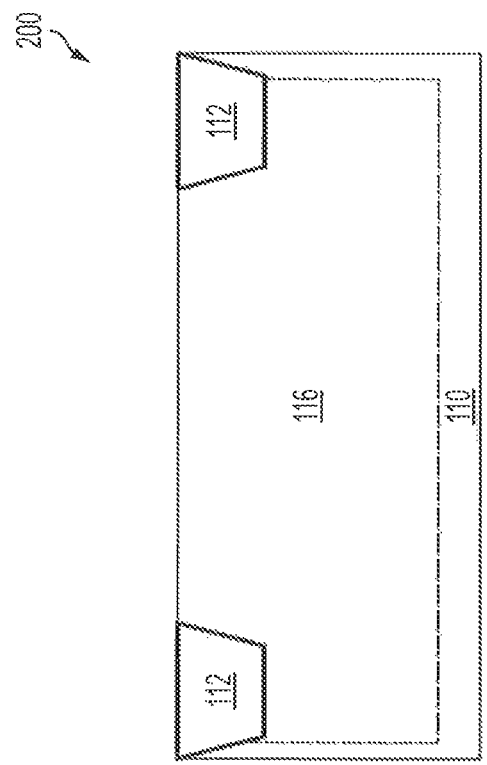
Figure 2:
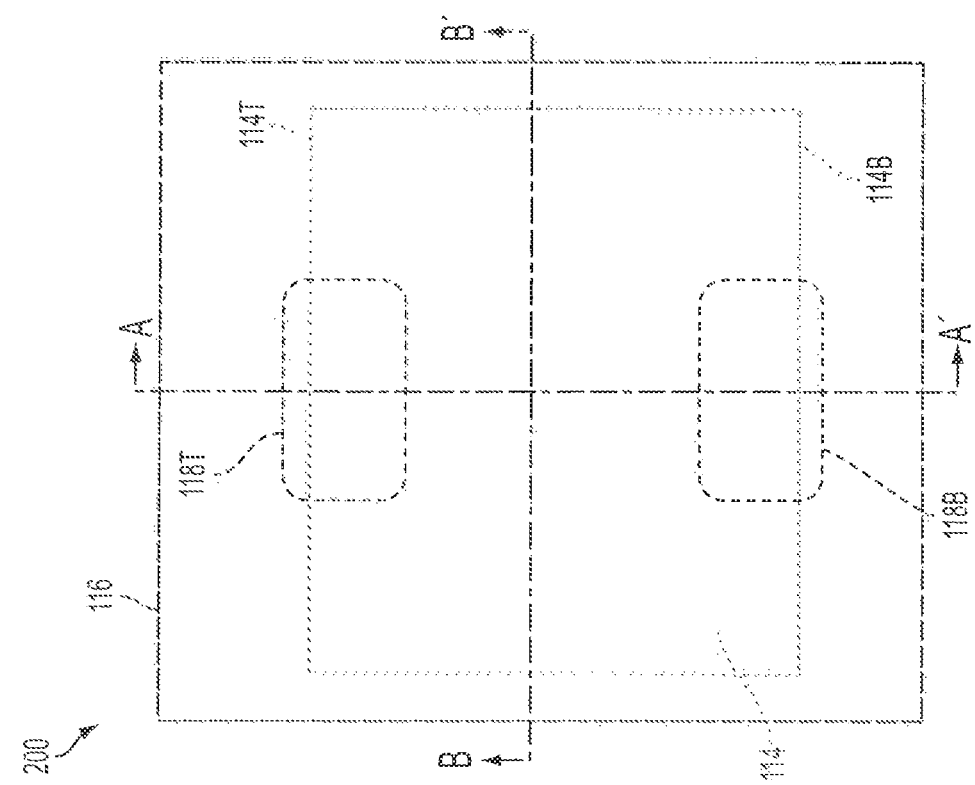
FIGS. 2-6 are top views of a semiconductor device at various stages during manufacture in accordance with some embodiments.

FIG. 2 is a top view of a structure 200 of the semiconductor device 100 being manufactured in accordance with some embodiments. FIGS. 2A-2B are cross-sectional views taken along lines A-A' and B-B' in FIG. 2. The structure 200 is formed by forming the isolation feature 112 in the substrate 110 to surround the active region 114. In at least one embodiment, an epitaxial layer (not shown) is formed in the active region 114. The HV well 116 is next formed formed in the substrate 100. The HV well 116 is an n-well formed by, e.g., implanting an n-type dopant, such as phosphorous, to a doping concentration of 1E15~1E18 atoms/cm3 and a depth of 2~5 um. The lightly doped wells 118T, 118B are next formed in the HV well 116 to overlap the corresponding edges 114T, 114B of the active region 114. The lightly doped wells 118T, 118B are p-wells formed by, e.g., implanting a p-type dopant, such as boron, to a doping concentration of 1E15~5e17 atoms/cm3 and a depth of 0.4~2 um.

Figure 3A:
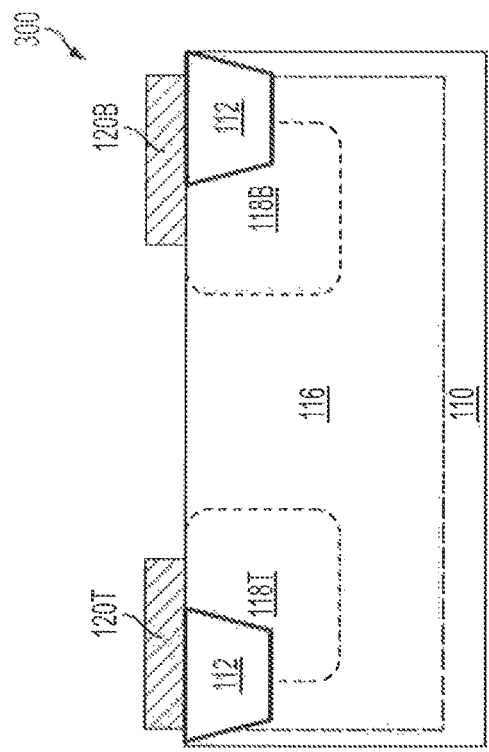
Figure 3B:
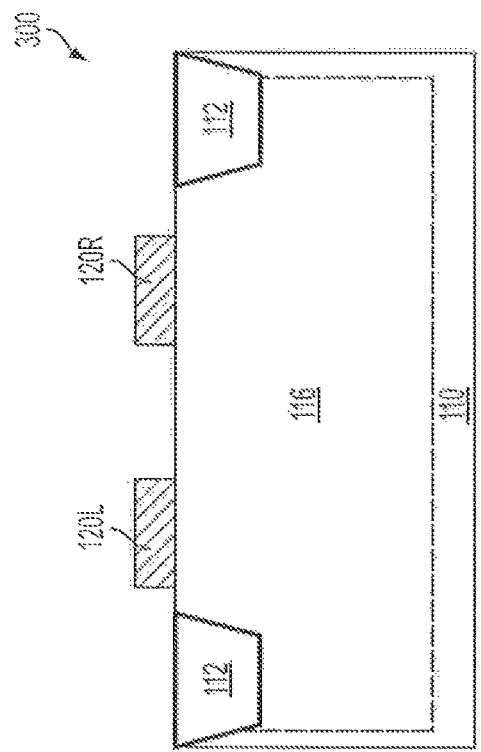
Figure 3:
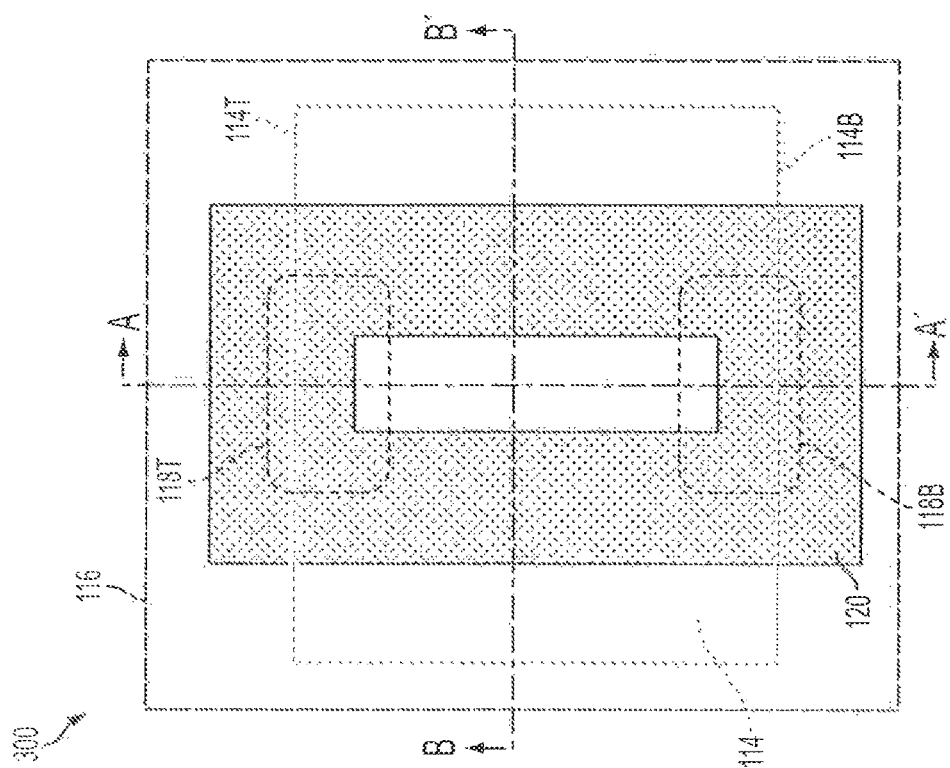

FIG. 3 is a top view of a structure 300 of the semiconductor device 100 being manufactured in accordance with some embodiments. FIGS. 3A-3B are cross-sectional views taken along lines A-A' and B-B' in FIG. 3. The structure 300 is formed by forming the gate structure 120 over the structure 200. For example, a gate dielectric layer (not shown) is deposited over the structure 200, e.g., by using a thermal oxidation process. A conductive gate material is deposited over the gate dielectric layer, e.g., by using a chemical vapor deposition process. The gate dielectric layer and the conductive gate material are patterned, e.g., by an anisotropic etch using a fluorine containing etching gas to obtain the gate structure 120. The gate structure 120 overlaps the corresponding edges 114T, 114B of the active region 114.

Figure 4A:
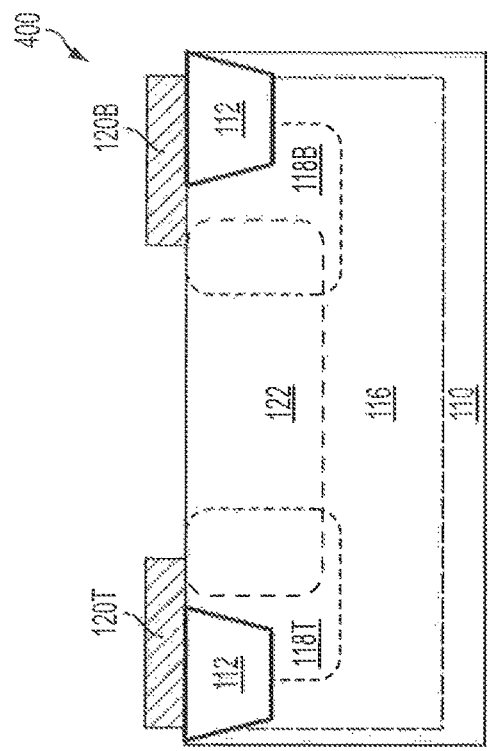
Figure 4B:
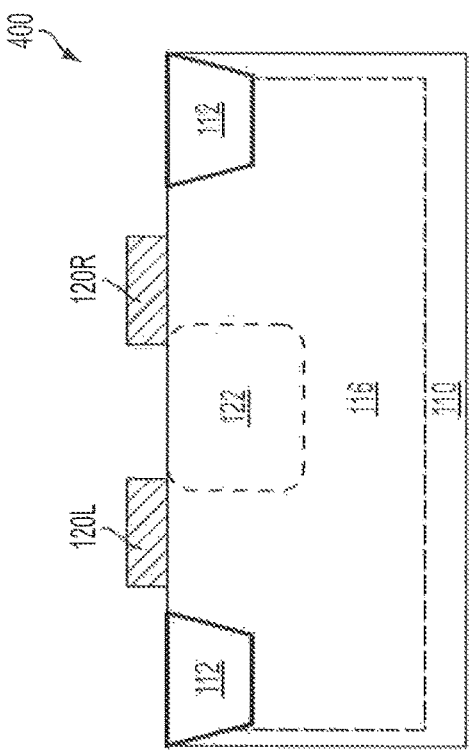
Figure 4:
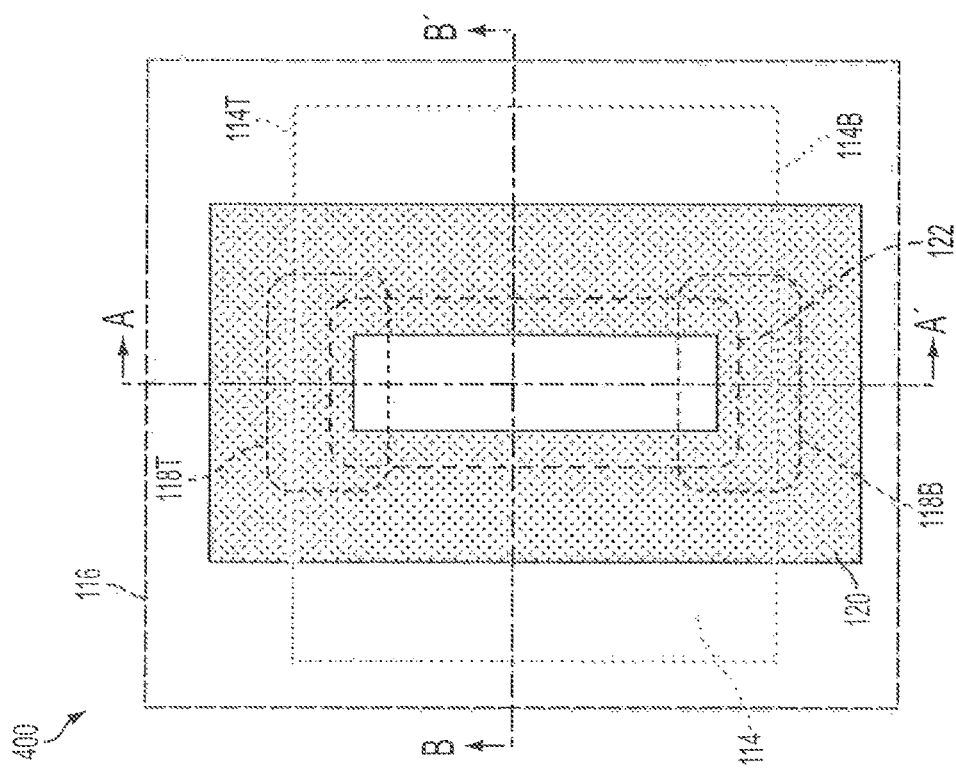

FIG. 4 is a top view of a structure 400 of the semiconductor device 100 being manufactured in accordance with some embodiments. FIGS. 4A-4B are cross-sectional views taken along lines A-A' and B-B' in FIG. 4. The structure 400 is formed by forming the standard well 122 in the structure 300. For example, the standard well 122 is a p-well formed by, e.g., implanting a p-type dopant to a doping concentration of 1E15~1E18 atoms/cm3 and a depth of 0.2~4 um. In at least one embodiment, the gate structure 120 is used as a mask for the ion implantation of the standard well 122.

Figure 5A:
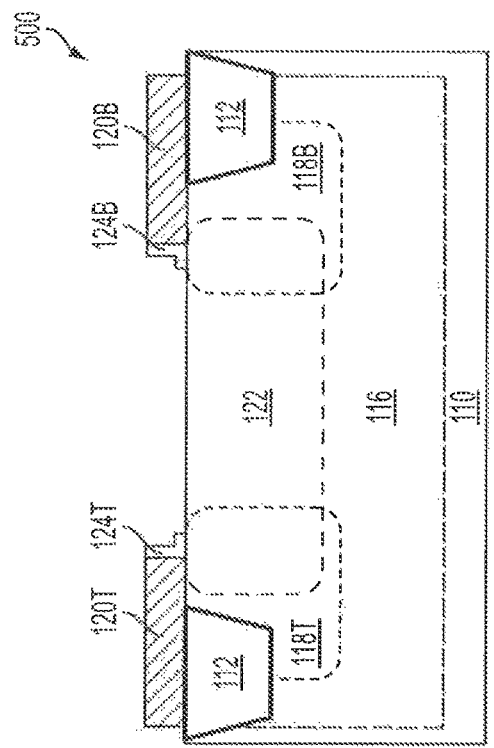
Figure 5B:
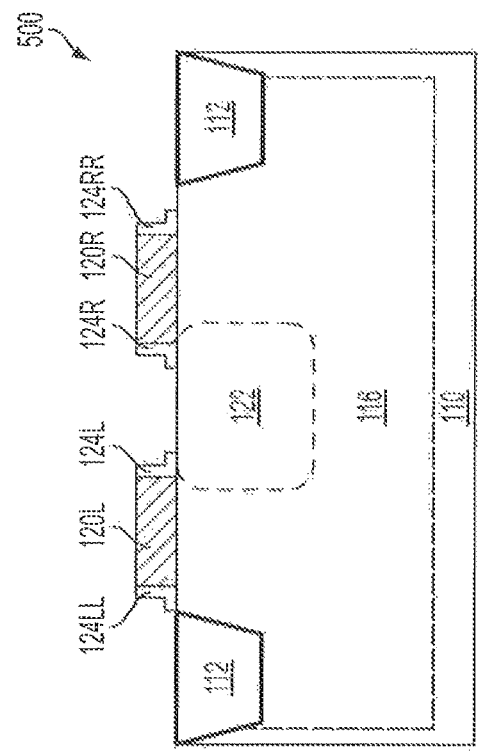
Figure 5:
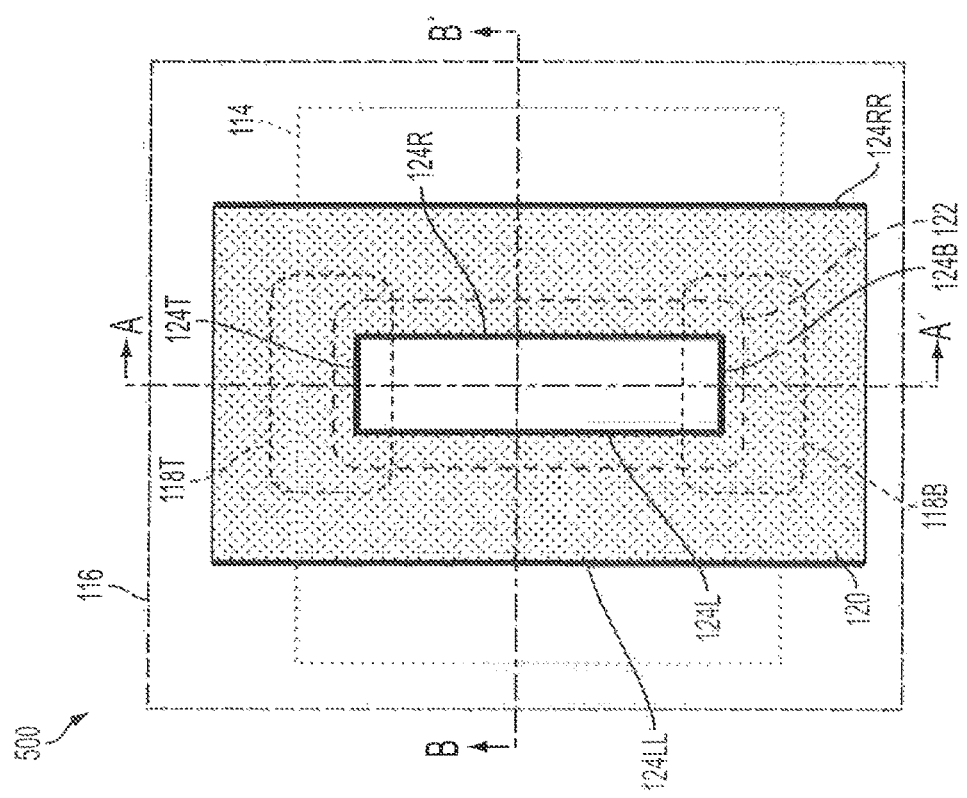

FIG. 5 is a top view of a structure 500 of the semiconductor device 100 being manufactured in accordance with some embodiments. FIGS. 5A-5B are cross-sectional views taken along lines A-A' and B-B' in FIG. 5. The structure 500 is formed by forming one or more spacers 124T, 124B, 124L, 124R, 124LL, 124RR over the sidewalls of the gate structure 120 in the structure 400. The spacers 124T, 124B, 124L, 124R, 124LL, 124RR are schematically shown in FIG. 1 as dark lines along edges of the gate structure 120. For example, a dielectric layer is conformably deposited over the structure 400, e.g., by chemical vapor deposition (CVD). The dielectric layer is then patterned, e.g., by an anisotropic etch using a fluorine containing etching gas to obtain the spacers 124T, 124B, 124L, 124R, 124LL, 124RR.

Figure 6A:
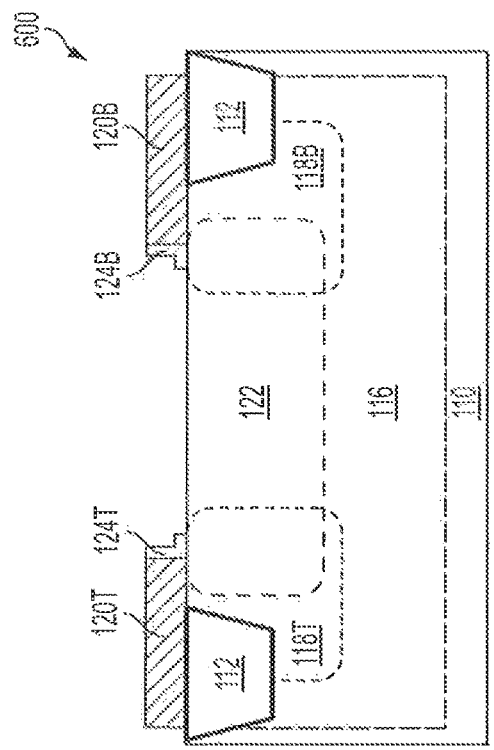
Figure 6B:
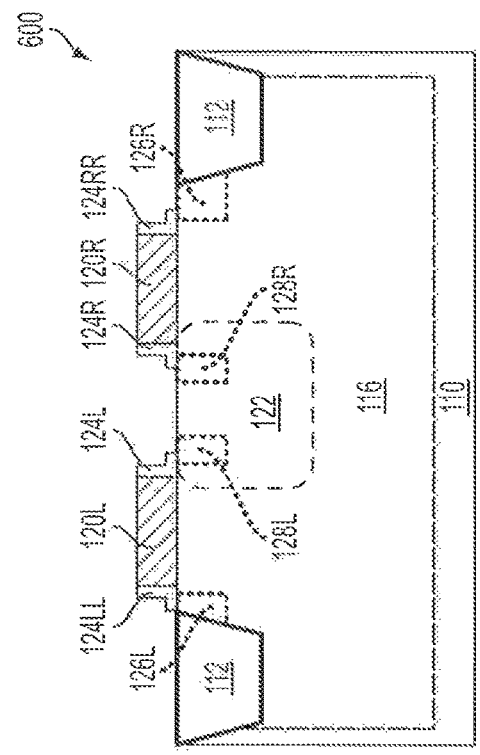
Figure 6:
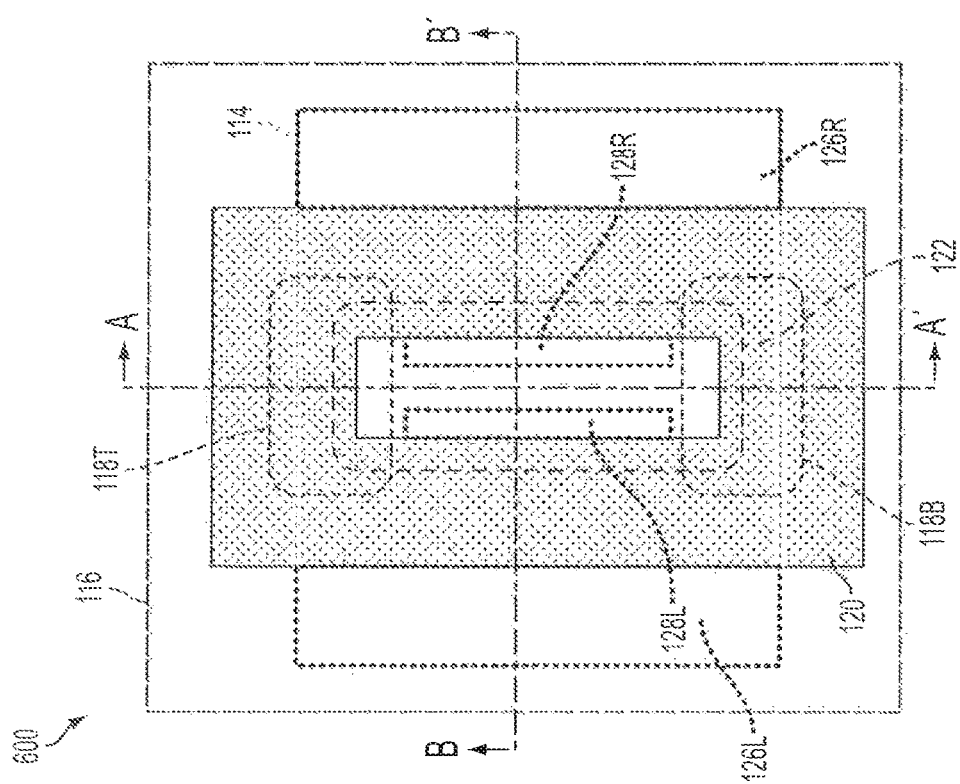

FIG. 6 is a top view of a structure 600 of the semiconductor device 100 being manufactured in accordance with some embodiments. FIGS. 6A-6B are cross-sectional views taken along lines A-A' and B-B' in FIG. 6. The structure 600 is formed by forming the source regions 128L, 128R and the drain regions 126L, 126R in the active region 114 of the structure 500. For example, the source regions 128L, 128R and drain regions 126L, 126R are formed by, e.g., implanting an n-type dopant to a doping concentration of 1E18~1e21 atoms/cm3 and a depth of 0.02~0.2 um. In at least one embodiment, one or more of the spacers 124T, 124B, 124L, 124R, 124LL, 124RR is/are used as a mask for the ion implantation of the source regions 128L, 128R and/or the drain regions 126L, 126R.

The process continues with a formation of the heavily doped well 130 in the structure 600 to obtain the semiconductor device 100. For example, the heavily doped well 130 is formed by, e.g., implanting a p-type dopant to a doping concentration of 1E18~1e21 atoms/cm3 and a depth of 0.02~0.2 um. In at least one embodiment, the first section 130T, the second section 130B and the third section 130C of the heavily doped well 130 are formed by using the same mask.

Figure 7A:
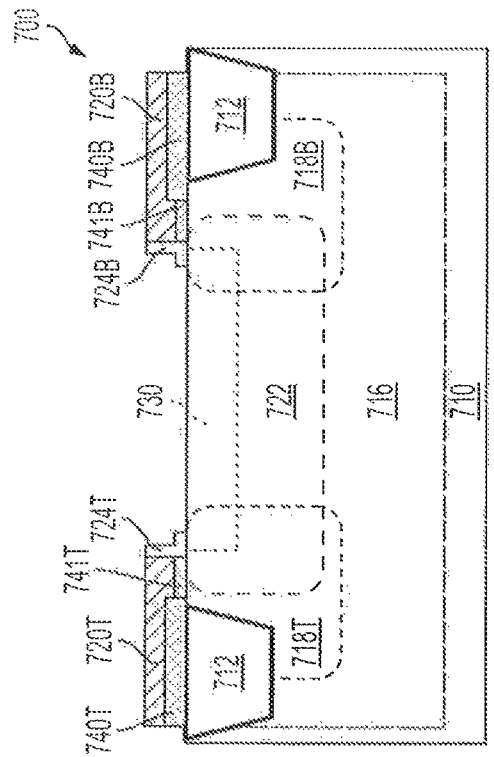
FIGS. 7, 7A and 7B are views similar to corresponding FIGS. 1, 1A and 1B, and showing a semiconductor device in accordance with some embodiments.
Figure 7B:
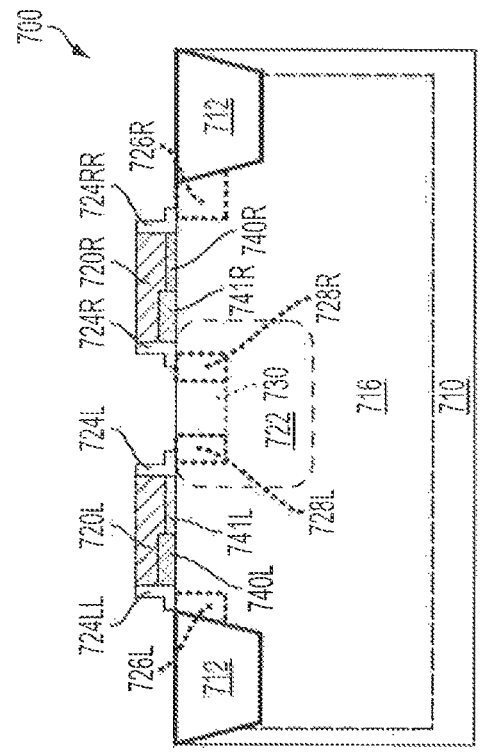
Figure 7:
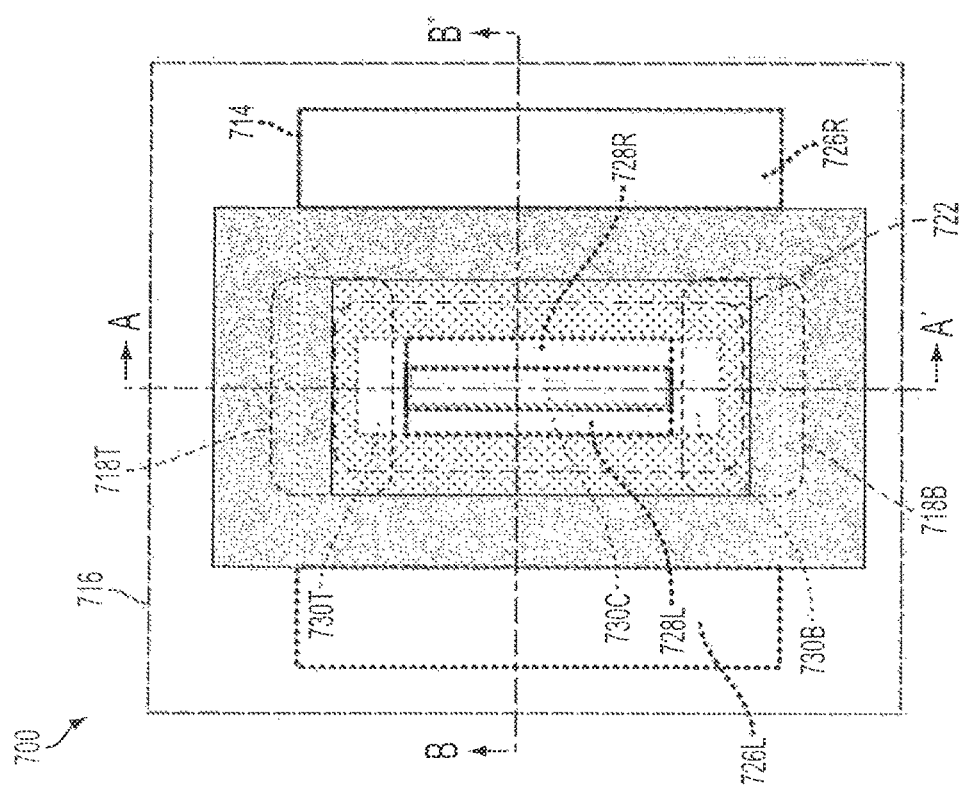

FIG. 7 is a top view of a semiconductor device 700 in accordance with some embodiments. FIGS. 7A-7B are cross-sectional views taken along lines A-A' and B-B' in FIG. 7. Elements in FIGS. 7, 7A and 7B having corresponding elements in FIGS. 1, 1A and 1B are designated by the reference numerals of FIGS. 1, 1A and 1B increased by six hundreds. A difference between the semiconductor device 700 and the semiconductor device 100 is that the semiconductor device 700 has a gate dielectric layer 740 (best seen in FIG. 8 described herein below) having a non-uniform thickness. The gate electrode layer gate dielectric layer 740 includes an outer portion defined by a first outer section 740L, a second outer section 740R, a third outer section 740T and a fourth outer section 740B. The gate electrode layer gate dielectric layer 740 further includes an inner portion defined by a first inner section 741L, a second inner section 741R, a third inner section 741T and a fourth inner section 741B. The outer portion of the gate dielectric layer 740 is thicker than the inner portion, as best seen in FIGS. 7A-7B. For example, the first outer section 740L, second outer section 740R, third outer section 740T and fourth outer section 740B have a greater thickness than the corresponding first inner section 741L, second inner section 741R, third inner section 741T and fourth inner section 741B. In some embodiments, a thickness of the gate dielectric layer 740 in each of the outer, thicker portion and the inner, thinner portion is 20~1200 Å.

The outer, thicker portion of the gate dielectric layer 740 is closer to the edges of the active region 714 (best seen in FIG. 8 described herein below) than the inner, thinner portion of the gate dielectric layer 740. As a result, it is possible in at least one embodiment for the semiconductor device 700 to sustain a high breakdown voltage between during an OFF state. The breakdown voltage characteristic of the semiconductor device 700 is therefore improved. The inner, thinner portion of the gate dielectric layer 740 is closer to the source regions 728L, 728R, and permits the semiconductor device 700 to exhibit a low driving voltage in one or more embodiments.

A manufacturing process of the semiconductor device 700 in accordance with some embodiments will be now described with respect to FIGS. 8-9, 8A-9A and 8B-9B.

Figure 8A:
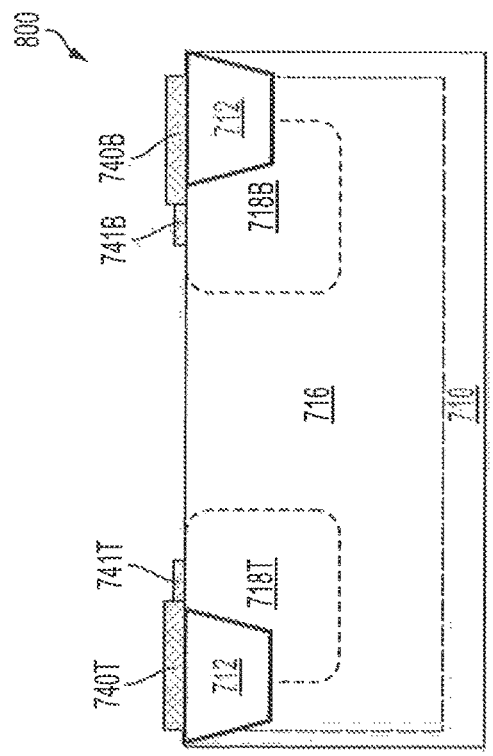
Figure 8B:
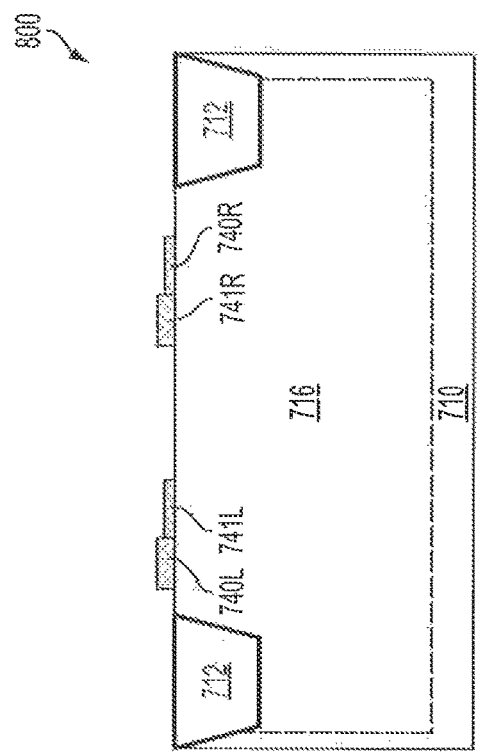
Figure 8:
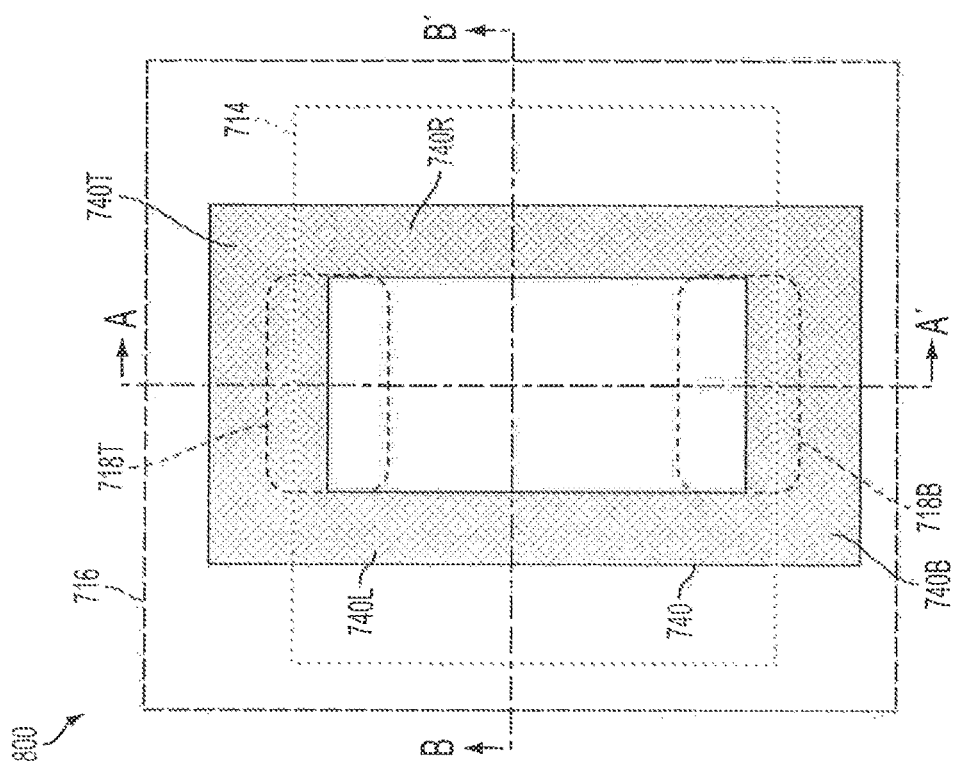
FIGS. 8-9 are top views of a semiconductor device at various stages during manufacture in accordance with some embodiments.

FIG. 8 is a top view of a structure 800 of the semiconductor device 700 being manufactured in accordance with some embodiments. FIGS. 8A-8B are cross-sectional views taken along lines A-A' and B-B' in FIG. 8. The structure 800 is formed by forming the gate dielectric layer 740 over a structure similar to the structure 200 described herein. For example, the gate dielectric layer 740 is formed by forming a first gate dielectric layer over the structure 200, e.g., by a thermal oxidation process. The first gate dielectric layer has a thickness of the inner, thinner portion of the gate dielectric layer 740 to be formed. The first gate dielectric layer is patterned to have a shape corresponding to that of the gate dielectric layer 740. Next, a second gate dielectric layer is formed over the first gate dielectric layer, e.g., by CVD. The second gate dielectric layer has a thickness such that a portion where the first and second gate dielectric layers overlap has thickness of the outer, thicker portion of the gate dielectric layer 740 to be formed. The second gate dielectric layer is patterned to have a shape corresponding to that of the outer, thicker portion of the gate dielectric layer 740. After patterning the first and second gate dielectric layers, the remaining portion where the patterned first and second gate dielectric layers overlap defines the first outer section 740L, second outer section 740R, third outer section 740T and fourth outer section 740B. The remaining portion of the first gate dielectric layer not underlying the second gate dielectric layer defines the first inner section 741L, second inner section 741R, third inner section 741T and fourth inner section 741B. The structure 800 is thus obtained.

Figure 9A:
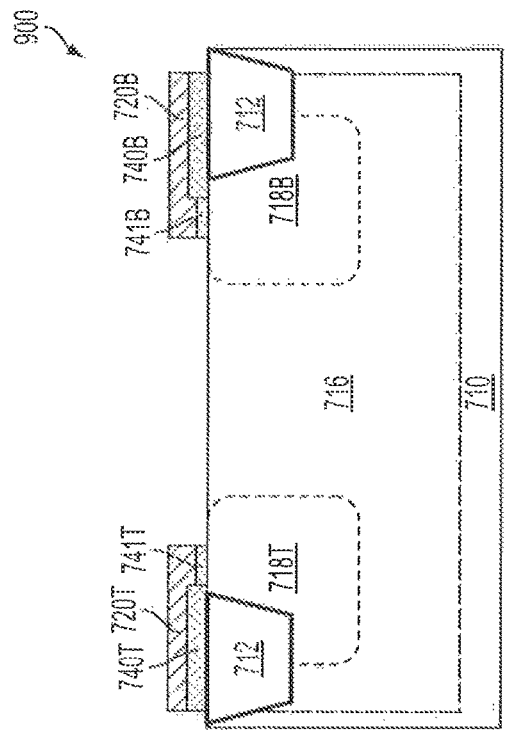
Figure 9B:
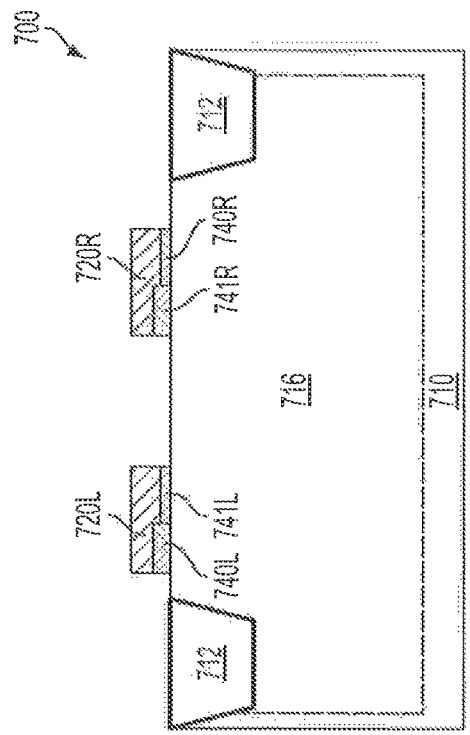
Figure 9:
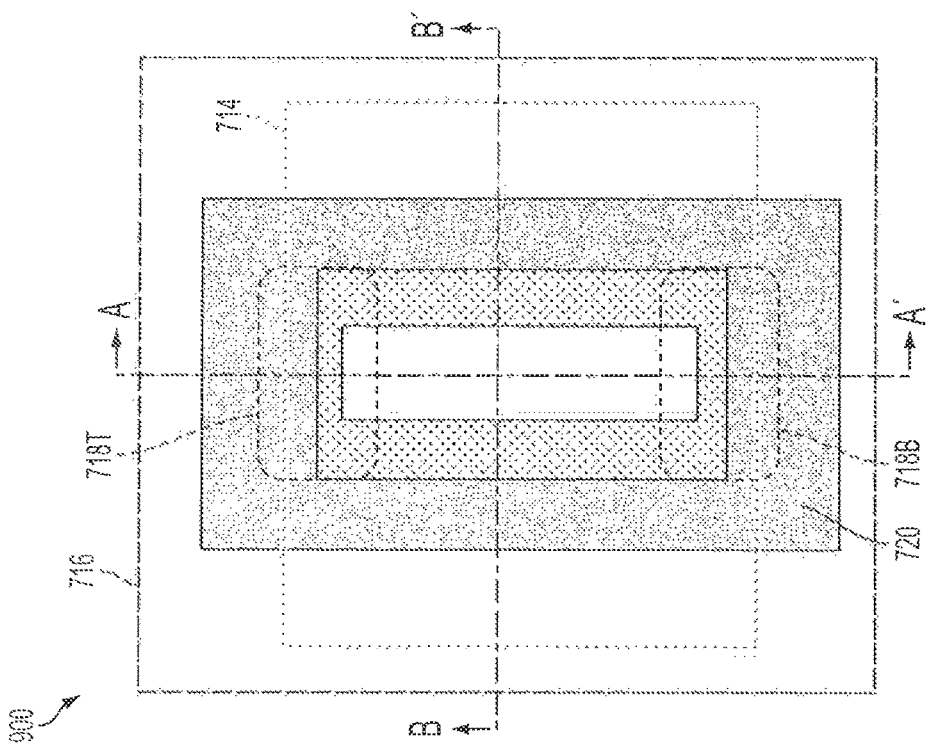

FIG. 9 is a top view of a structure 900 of the semiconductor device 700 being manufactured in accordance with some embodiments. FIGS. 9A-9B are cross-sectional views taken along lines A-A' and B-B' in FIG. 9. The structure 900 is formed by forming the gate structure 720 over the structure 800 described. For example, the gate structure 720 is formed in a manner described with respect to FIG. 3. The standard well 722, one or more spacers, drain regions 726L, 726R, source regions 728L, 728R and heavily doped well 730 are subsequently formed in/over the structure 900, as described with respect to FIGS. 4-6, to obtain the semiconductor device 700.

Figure 10A:
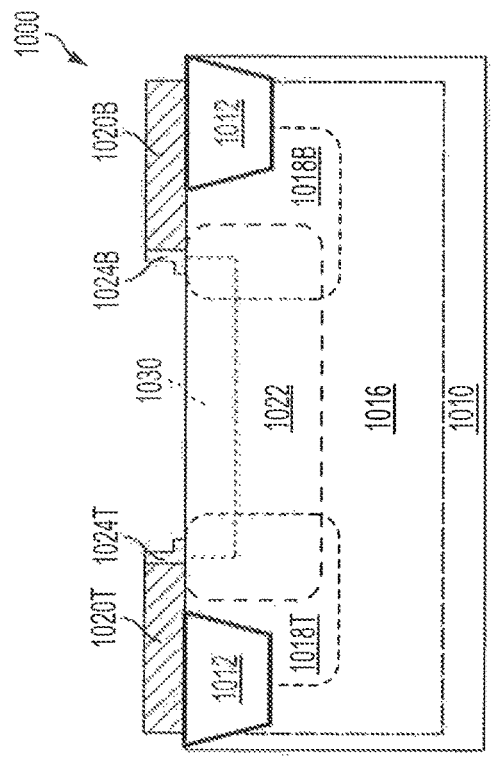
FIGS. 10, 10A and 10B are views similar to corresponding FIGS. 1, 1A and 1B, and showing a semiconductor device in accordance with some embodiments.
Figure 10B:
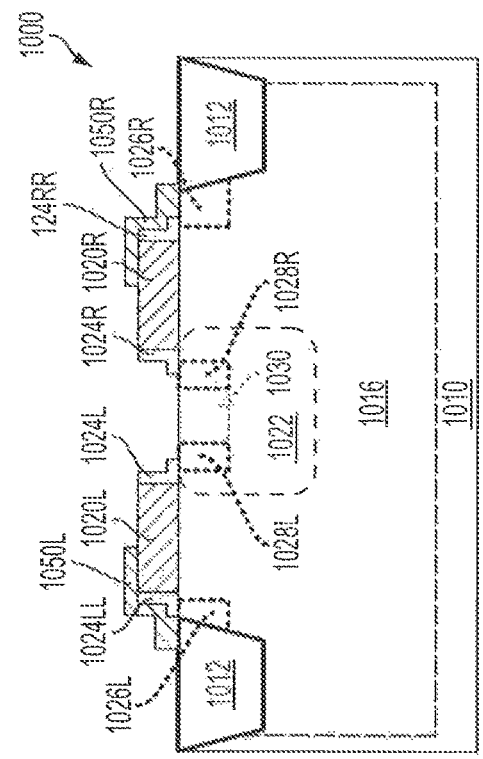
Figure 10:
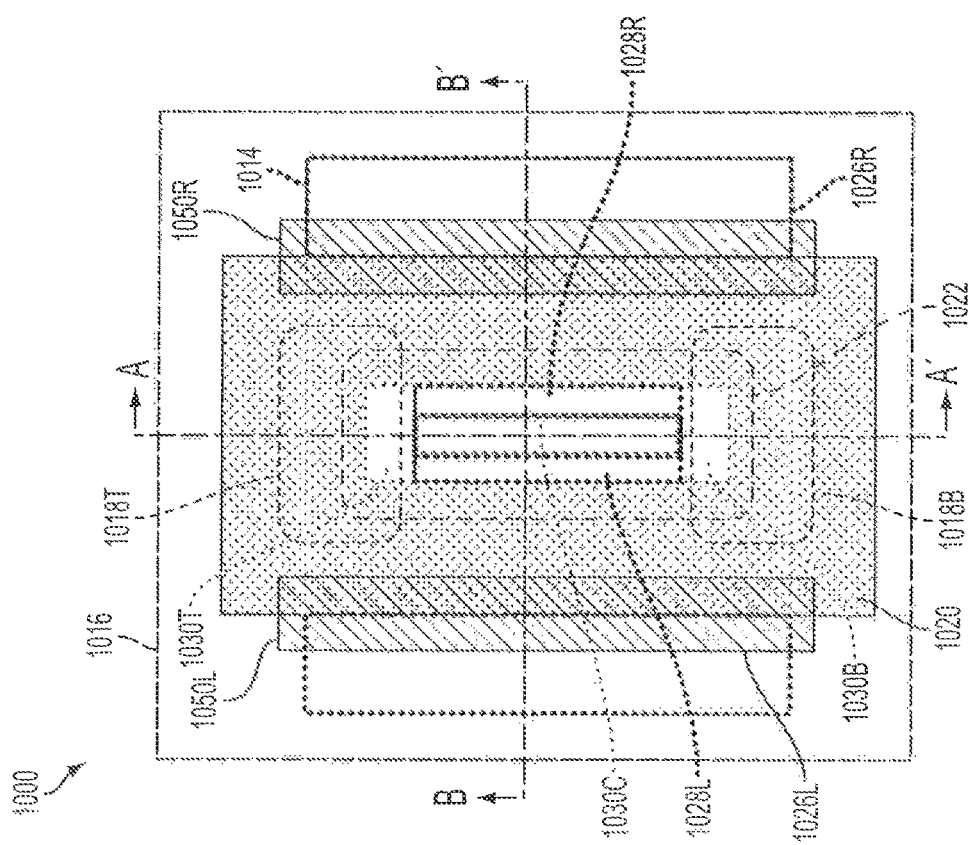

FIG. 10 is a top view of a semiconductor device 1000 in accordance with some embodiments. FIGS. 10A-10B are cross-sectional views taken along lines A-A' and B-B' in FIG. 10. Elements in FIGS. 10, 10A and 10B having corresponding elements in FIGS. 1, 1A and 1B are designated by the reference numerals of FIGS. 1, 1A and 1B increased by nine hundreds. A difference between the semiconductor device 1000 and the semiconductor device 100 is that the semiconductor device 1000 has a resist protect oxide (RPO) layer 1050L, 1050R formed over the corresponding spacers 1024LL, 1024RR. The RPO layer 1050L, 1050R covers partially the drain regions 1026L, 1026R. In at least one embodiment, the RPO layer 1050L, 1050R covers partially the gate structure 1020. An example material for the RPO layer 1050L, 1050R includes, but is not limited to, silicon dioxide. A silicide process is performed to form a silicide over the drain regions 1026L, 1026R. A portion of the drain regions 1026L, 1026R covered by the RPO layer 1050L, 1050R remains unsilicided and provides a highly resistive region configured to sustain a high voltage. As a result, the breakdown voltage of the semiconductor device 1000 is improved.

Figure 11:
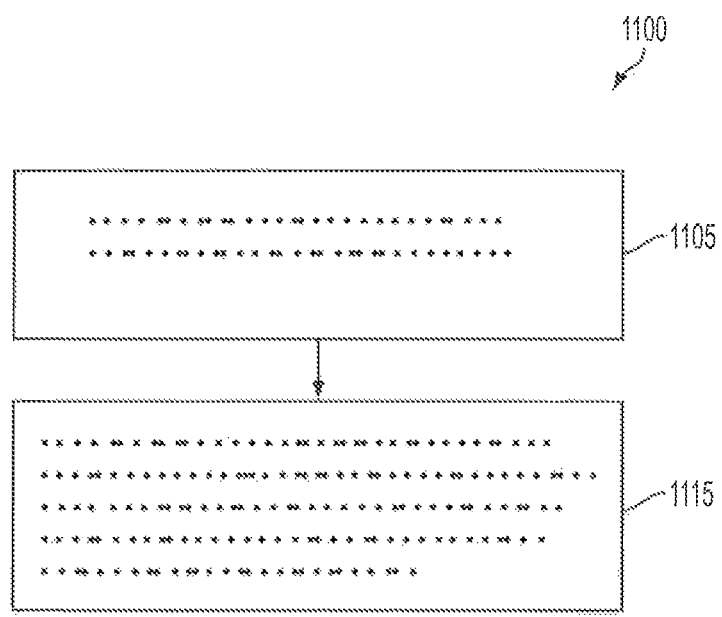
FIG. 11 is a flow chart of a method of manufacturing a semiconductor device in accordance with some embodiments.

FIG. 11 is a flow chart of a method 1100 of manufacturing a semiconductor device in accordance with some embodiments.

At operation 1105, a gate structure is formed over an active region of a substrate. For example, the gate structure 120 is formed over the active region 114 of the substrate 110 as described with respect to FIGS. 1-3, 1A-3A and 1B-3B.

At operation 1115, a conductive field plate is formed over the substrate, the field plate extending between first and second sections of the gate structure and overlapping an edge of the active region. For example, a field plate is formed as a portion of the gate structure 120, i.e., the third section 120T and the fourth section 120B, that extend between the first section 120L and the second section 120R of the gate structure 120, and overlap the corresponding edges 114T, 114B of the active region 114, as described with respect to FIGS. 1, 1A and 1B.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a substrate having an active region, a drain region in the active region, a source region in the active region, a gate structure, and a conductive field plate. The gate structure extends in a first direction over the active region. The gate structure is arranged between the drain region and the source region in a second direction transverse to the first direction. The conductive field plate extends in the second direction over an edge of the active region.

According to some embodiments, a semiconductor device comprises a substrate having an active region, at least one first source/drain region in the active region, at least one second source/drain region in the active region, at least one first well and a second well in the substrate. The at least one first well overlaps at least one edge of the active region. The second well overlaps the at least one first well and surrounds the at least one first source/drain region.

In a method of manufacturing a semiconductor device in accordance with some embodiments, a gate structure is formed over an active region of a substrate. The gate structure comprises a first section and a second section. The first section and the second section divide the active region into a first source/drain region between the first section and the second section, and a pair of second source/drain regions arranged on opposite sides of the gate structure. A conductive field plate is formed over the substrate. The field plate extends between the first section and the second section and overlaps an edge of the active region.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
    a substrate having an active region;
    a drain region in the active region;
    a source region in the active region;
    a structure comprising a gate and a spacer, wherein the structure extends in a first direction over the active region, the structure is arranged between the drain region and the source region in a second direction transverse to the first direction, and the structure overlaps at least a portion of the drain region;

a conductive field plate extending in the second direction over an edge of the active region;
a first well in the substrate, the first well overlapping the edge of the active region; and
an isolation structure in the substrate, wherein a first portion the conductive field plate extends over the isolation structure.

2. The semiconductor device of claim 1, further comprising:
a second well in the substrate, the second well overlapping the first well and surrounding one of the drain region or the source region.

3. The semiconductor device of claim 2, further comprising:
a third well in the substrate and within the second well, the third well overlapping the first well.

4. The semiconductor device of claim 3, wherein the first well, the second well and the third well have a same dopant conductivity.

5. The semiconductor device of claim 4, wherein
a dopant concentration of the first well is less than or equal to a dopant concentration of the second well, and
the dopant concentration of the second well is less than or equal to a dopant concentration of the third well.

6. The semiconductor device of claim 4, further comprising:
a fourth well in the substrate, wherein
the first well, the second well and the third well are arranged within the fourth well, and
a dopant conductivity of the fourth well is opposite to the dopant conductivity of the first well, the second well and the third well.

7. The semiconductor device of claim 1, wherein the field plate is a portion of the structure.

8. The semiconductor device of claim 7, wherein
the structure comprises a first section and a second section,
the first section and the second section are arranged on opposite sides of one of the drain region and the source region in the second direction, and
the field plate extends in the second direction and connects the first section and the second section.

9. A semiconductor device, comprising:
a substrate having an active region;
at least one first source/drain region in the active region;
at least one second source/drain region in the active region, wherein the at least one second source/drain region is separated from the at least one first source/drain region;
at least one first well in the substrate, wherein the at least one first well overlaps at least one edge of the active region, and the at least one first well is spaced from both of the at least one first source/drain region and the at least one second source/drain region;
a second well in the substrate, the second well overlapping the at least one first well and surrounding the at least one first source/drain region; and
a third well in the substrate and within the second well, the third well overlapping the at least one first well,
wherein the at least one first source/drain region comprises two first source/drain regions arranged on opposite sides of the third well.

10. The semiconductor device of claim 9, wherein
the at least one first well comprises two first wells overlapping opposite edges of the active region.

11. The semiconductor device of claim 9, further comprising:
a ring-shaped gate structure, the gate structure surrounding the at least one first source/drain region and overlapping the at least one edge of the active region.

12. A semiconductor device, comprising:
a substrate having an active region;
a gate structure over the active region of the substrate, the gate structure comprising a first section and a second section, the first section and the second section dividing the active region into
a first pair of source/drain regions between the first section and the second section, wherein each source/drain region of the first pair of source/drain regions are physically separated from each other, and
a second pair of second source/drain regions arranged on opposite sides of the gate structure;
a conductive field plate over the substrate, the field plate extending between the first section and the second section and overlapping an edge of the active region;
a first well in the substrate, the first well underlying the field plate and overlapping the edge of the active region;
a second well in the substrate, the second well overlapping the first well and surrounding the first pair of source/drain regions; and
a third well in the substrate and within the second well, the third well overlapping the first well,
wherein the first well, the second well and the third well have a same dopant conductivity.

13. The semiconductor device of claim 12, wherein the third well comprises:
a first portion;
a second portion, the first portion and the second portion spaced from each other in a first direction and extending in a second direction transverse to the first direction; and
a third portion extending in the first direction and connecting the first portion and the second portion.

14. The semiconductor device of claim 9, wherein the at least one first well, the second well and the third well have a same dopant conductivity.

15. The semiconductor device of claim 14, wherein
a dopant concentration of the at least one first well is less than or equal to a dopant concentration of the second well, and
the dopant concentration of the second well is less than or equal to a dopant concentration of the third well.

16. The semiconductor device of claim 14, further comprising:
a fourth well in the substrate, wherein
the first well, the second well and the third well are arranged within the fourth well, and a dopant conductivity of the fourth well is opposite to the dopant conductivity of the first well, the second well and the third well.

17. The semiconductor device of claim 12, wherein
a dopant concentration of the first well is less than or equal to a dopant concentration of the second well, and
the dopant concentration of the second well is less than or equal to a dopant concentration of the third well.

18. The semiconductor device of claim 12, further comprising:
a fourth well in the substrate, wherein
the first well, the second well and the third well are arranged within the fourth well, and a dopant conductivity of the fourth well is opposite to the dopant conductivity of the first well, the second well and the third well.

19. The semiconductor device of claim 12, wherein the conductive field plate is a portion of the gate structure.

20. The semiconductor device of claim 1, wherein a second portion of the conductive field plate extends beyond the isolation structure.

* * * * *